United States Patent
Miyahara et al.

(10) Patent No.: US 7,618,895 B2
(45) Date of Patent: Nov. 17, 2009

(54) METHOD FOR ETCHING DOUGHNUT-TYPE GLASS SUBSTRATES

(75) Inventors: Osamu Miyahara, Yokohama (JP); Masami Kaneko, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 757 days.

(21) Appl. No.: 11/274,303

(22) Filed: Nov. 16, 2005

(65) Prior Publication Data
US 2006/0118521 A1 Jun. 8, 2006

(30) Foreign Application Priority Data
Dec. 6, 2004 (JP) ............... 2004-352994

(51) Int. Cl.
*H01L 21/302* (2006.01)
(52) U.S. Cl. .................. 438/723; 216/17; 216/80
(58) Field of Classification Search ............ 438/723, 438/756; 216/17, 58, 74, 80, 83, 96, 97
See application file for complete search history.

(56) References Cited

U.S. PATENT DOCUMENTS

| | | | |
|---|---|---|---|
| 4,654,115 A * | 3/1987 | Egitto et al. ............ 134/1.1 |
| 5,538,579 A | 7/1996 | Ishimura et al. | |
| 5,569,518 A * | 10/1996 | Hayashi ............ 428/141 |
| 5,654,057 A | 8/1997 | Kitayama et al. | |
| 5,681,609 A | 10/1997 | Kitayama et al. | |
| 5,725,625 A | 3/1998 | Kitayama et al. | |
| 5,871,654 A | 2/1999 | Mannami et al. | |
| 5,895,582 A * | 4/1999 | Wilson et al. ............ 216/42 |
| 5,900,296 A | 5/1999 | Hayashi et al. | |
| 5,916,656 A | 6/1999 | Kitayama et al. | |
| 5,926,352 A | 7/1999 | Murayama et al. | |
| 6,280,294 B1 | 8/2001 | Miyamoto | |
| 6,363,599 B1 | 4/2002 | Bajorek | |

(Continued)

FOREIGN PATENT DOCUMENTS

JP 7-230621 8/1995

(Continued)

OTHER PUBLICATIONS

U.S. Appl. No. 11/293,292, filed Dec. 5, 2005, Miyahara, et al.

(Continued)

*Primary Examiner*—Kin-Chan Chen
(74) *Attorney, Agent, or Firm*—Oblon, Spivak, McClelland, Maier & Neustadt, L.L.P.

(57) ABSTRACT

A method for etching doughnut-type glass substrates, which comprises laminating a plurality of doughnut-type glass substrates each having a circular hole at its center so that the circular holes form a cylindrical hole, and applying an etching treatment to inner peripheral edge surfaces of the plurality of the laminated doughnut-type glass substrates all at once by means of an etching liquid or an etching gas, wherein the etching liquid or the etching gas is supplied from one end of the cylindrical hole, made to flow in the cylindrical hole, and discharged from the other end of the cylindrical hole so that it is not in contact with exposed main surfaces of the doughnut-type glass substrates at both ends of the laminate consisting of the doughnut-type glass substrates.

16 Claims, 2 Drawing Sheets

U.S. PATENT DOCUMENTS

| | | | |
|---|---|---|---|
| 6,641,465 | B2 | 11/2003 | Miyamoto |
| 6,664,503 | B1 | 12/2003 | Hsieh et al. |
| 6,718,612 | B2 | 4/2004 | Bajorek |
| 6,795,274 | B1 | 9/2004 | Hsieh et al. |
| 6,829,910 | B1 | 12/2004 | Hsieh et al. |
| 6,949,485 | B2 | 9/2005 | Nakashima et al. |
| 7,070,481 | B1 | 7/2006 | Miyamoto |
| 7,438,630 | B2 | 10/2006 | Miyamoto |
| 7,346,250 | B1 * | 3/2008 | Dabich et al. ............... 385/125 |
| 2001/0049031 | A1 | 12/2001 | Bajorek et al. |
| 2003/0017296 | A1 * | 1/2003 | Kaneko ..................... 428/66.6 |
| 2003/0053047 | A1 * | 3/2003 | Kawai et al. ................ 356/246 |
| 2003/0175471 | A1 | 9/2003 | Kaneko |
| 2003/0179494 | A1 | 9/2003 | Kaneko |
| 2005/0142321 | A1 * | 6/2005 | Miyahara et al. ........... 428/64.2 |
| 2006/0128154 | A1 * | 6/2006 | Miyahara et al. ............ 438/692 |
| 2006/0128278 | A1 | 6/2006 | Miyamoto |

FOREIGN PATENT DOCUMENTS

| | | |
|---|---|---|
| JP | 9-124343 | 5/1997 |
| JP | 11-328665 | 11/1999 |
| JP | 2004-342307 | 12/2004 |

OTHER PUBLICATIONS

U.S. Appl. No. 11/336,964, filed Jan. 23, 2006, Watanabe et al.
U.S. Appl. No. 09/391,139, filed Sep. 7, 1999, John Hsieh, et al.
U.S. Appl. No. 11/257,160, filed Oct. 25, 2005, Masami Kaneko.
U.S. Appl. No. 11/201,386, filed Aug. 11, 2005, Osamu Miyahara, et al.

* cited by examiner

METHOD FOR ETCHING DOUGHNUT-TYPE GLASS SUBSTRATES

The present invention relates to a method for etching inner peripheral edge surfaces of doughnut-type glass substrates.

As a doughnut-type substrate to be used for e.g. magnetic disk memory devices, an aluminum alloy substrate has been mainly employed. However, along with the demand for high density recording, a glass substrate has now been employed which is excellent in flatness and smoothness and of which the base material itself is hard as compared with an aluminum alloy substrate. However, a doughnut-type substrate made of glass which is a brittle material, is likely to break during handling or during use, which is regarded as one of the problems.

One of factors governing the mechanical strength of a doughnut-type glass substrate for magnetic disks, is scars which are present on the inner peripheral edge surface of the glass substrate where the maximum tensile stress will be exerted by high speed rotation during use of the magnetic disks. In a doughnut-type substrate, it is common that the surface roughness of the inner peripheral edge surface and the outer peripheral edge surface (hereinafter sometimes generally referred to as the inner and outer peripheral edge surfaces) is coarse as compared with the main surface (the surface other than the inner and outer peripheral edge surfaces) required to have very high levels of flatness and smoothness. Namely, for example, when a doughnut-type glass substrate is cut out from a rectangular glass plate, the inner and outer peripheral edge surfaces are cut surfaces formed by cutting or coring the disk out of the glass plate into a doughnut shape, and they are not concerned with the magnetic recording. Besides, they are curved surfaces, which require a high cost for finish processing, whereby finish processing can not adequately be carried out.

In order to reduce the depth of scars on the inner and outer peripheral edge surfaces and thereby to improve the mechanical strength, finish processing of the inner and outer peripheral edge surfaces is carried out with abrasive grains finer than #500 mesh, but considerably deep scars may still remain on the inner and outer peripheral edge surfaces. In order to improve the finishing of the inner and outer peripheral edge surfaces, that is, in order to decrease the roughness, multi-step processing by means of abrasive grains having stepwise reduced grain sizes is effective. However, such multi-step processing has a problem that productivity will thereby be substantially deteriorated, and the cost remarkably increases.

As a glass substrate to solve the above-mentioned problems, for example, JP-A-7-230621 discloses to apply an etching treatment to a glass substrate by means of an etching liquid such as hydrofluoric acid or hydrofluoric sulfuric acid to reduce the surface roughness of particularly the inner peripheral edge surface, which governs the strength of the glass substrate. Further, JP-A-11-328665 discloses to cover the etched inner peripheral edge surface with e.g. a protective film obtained by curing a coating composition containing a polysilazane, so as to further improve the strength of such a glass substrate having an etching treatment applied thereto. As a method of etching the inner peripheral edge surface, the glass substrate is immersed in an etching liquid for the etching treatment in either publication.

As mentioned above, in a conventional etching method, since the glass substrate is immersed in an etching liquid, the entire glass substrate is etched, and it is impossible to apply an etching treatment only to the inner peripheral edge surface, which governs the strength of the substrate, to a desired depth. Accordingly, when deep scars on the inner peripheral edge surface are to be removed, the front and back surfaces of the substrate are also etched in a large etching amount (depth), whereby the surface roughness of the front and back surfaces tends to be significant, which may cause magnetic head crush, and destroy the entire recording surface of the magnetic disk. In JP-A-7-230621, the etching amount on the inner peripheral edge surface is suppressed to be at most a certain amount so as to prevent such excessive etching on the front and back surfaces of the substrate. If the etching amount on the inner peripheral edge surface is restricted in such a manner, if deep scars are present on the inner peripheral edge surface, they can not sufficiently be removed by etching, which may decrease the strength of the glass substrate.

The above problem can be solved by partially applying an etching treatment only to the inner peripheral edge surface of the glass substrate. However, if only the inner peripheral edge surface of the glass substrate is to be etched so that the front and back surfaces of the glass substrate are not substantially etched, it is required to prevent the etching liquid from being brought into contact with the front and back surfaces of the substrate, i.e. it is required to mask portions other than the inner peripheral edge surface of the glass substrate, which decreases the efficiency and the capacity of the etching operation and increases the cost.

Under these circumstances, it is an object of the present invention to provide a method for etching doughnut-type glass substrates, which makes it possible to apply an etching treatment only to inner peripheral edge surfaces of a large number of doughnut-type glass substrates all at once.

To achieve the above object, the present inventors have conducted extensive studies on a method for etching inner peripheral edge surfaces of doughnut-type glass substrates and as a result, found that an etching treatment can be applied substantially only to inner peripheral edge surfaces of doughnut-type glass substrates, by laminating a plurality of doughnut-type glass substrates so that their circular holes at their center form a cylindrical hole, and supplying an etching liquid or an etching gas to the cylindrical hole to etch the inner surface of the cylindrical hole. The present invention has been accomplished on the basis of this discovery. Namely, the present invention provides the following method for etching doughnut-type glass substrates.

(1) A method for etching doughnut-type glass substrates, which comprises laminating a plurality of doughnut-type glass substrates each having a circular hole at its center so that the circular holes form a cylindrical hole, and applying an etching treatment to inner peripheral edge surfaces of the plurality of the laminated doughnut-type glass substrates all at once by means of an etching liquid or an etching gas, wherein the etching liquid or the etching gas is supplied from one end of the cylindrical hole, made to flow in the cylindrical hole, and discharged from the other end of the cylindrical hole so that it is not in contact with exposed main surfaces of the doughnut-type glass substrates at both ends of the laminate consisting of the doughnut-type glass substrates.

(2) The method for etching doughnut-type glass substrates according the above (1), wherein the etching treatment is carried out in a state where the plurality of the laminated doughnut-type glass substrates are held so that the center axis of the cylindrical hole is perpendicular.

(3) The method for etching doughnut-type glass substrates according to the above (2), wherein a duct having a flow path with the same diameter as the diameter of the cylindrical hole is connected to one end of the cylindrical hole via a packing having a flow path with substantially the same diameter as the diameter of the cylindrical hole, and the etching liquid or the etching gas is supplied to said one end of the cylindrical hole employing a flow path thus formed.

(4) The method for etching doughnut-type glass substrates according to the above (1), (2) or (3), wherein the etching liquid or the etching gas after the etching treatment is recycled.

(5) The method for etching doughnut-type glass substrates according to any one of the above (1) to (4), wherein the etching treatment is carried out while rotating the plurality of the laminated doughnut-type glass substrates upon the center axis of the cylindrical hole.

(6) The method for etching doughnut-type glass substrates according to any one of the above (1) to (5), wherein the etching amount on the inner periphery edge surfaces is from 3 to 50 μm.

(7) The doughnut-type glass substrates according to any one of the above (1) to (6), wherein the etching treatment is carried out by means of an etching liquid.

According to the present invention, a plurality of doughnut-type glass substrates are laminated so that their circular holes at their center form a cylindrical hole, and an etching liquid or an etching gas is supplied to the cylindrical hole to etch the inner surface of the cylindrical hole. Accordingly, an etching treatment can be applied substantially only to inner peripheral edge surfaces of the doughnut-type glass substrates without etching the front and back surfaces of the substrates, and further, the inner peripheral edge surfaces of the laminated doughnut-type glass substrates can be etched at a time. Thus, inner peripheral edge surfaces of a large number of glass substrates can be etched all at once at a low cost.

Figure 1:
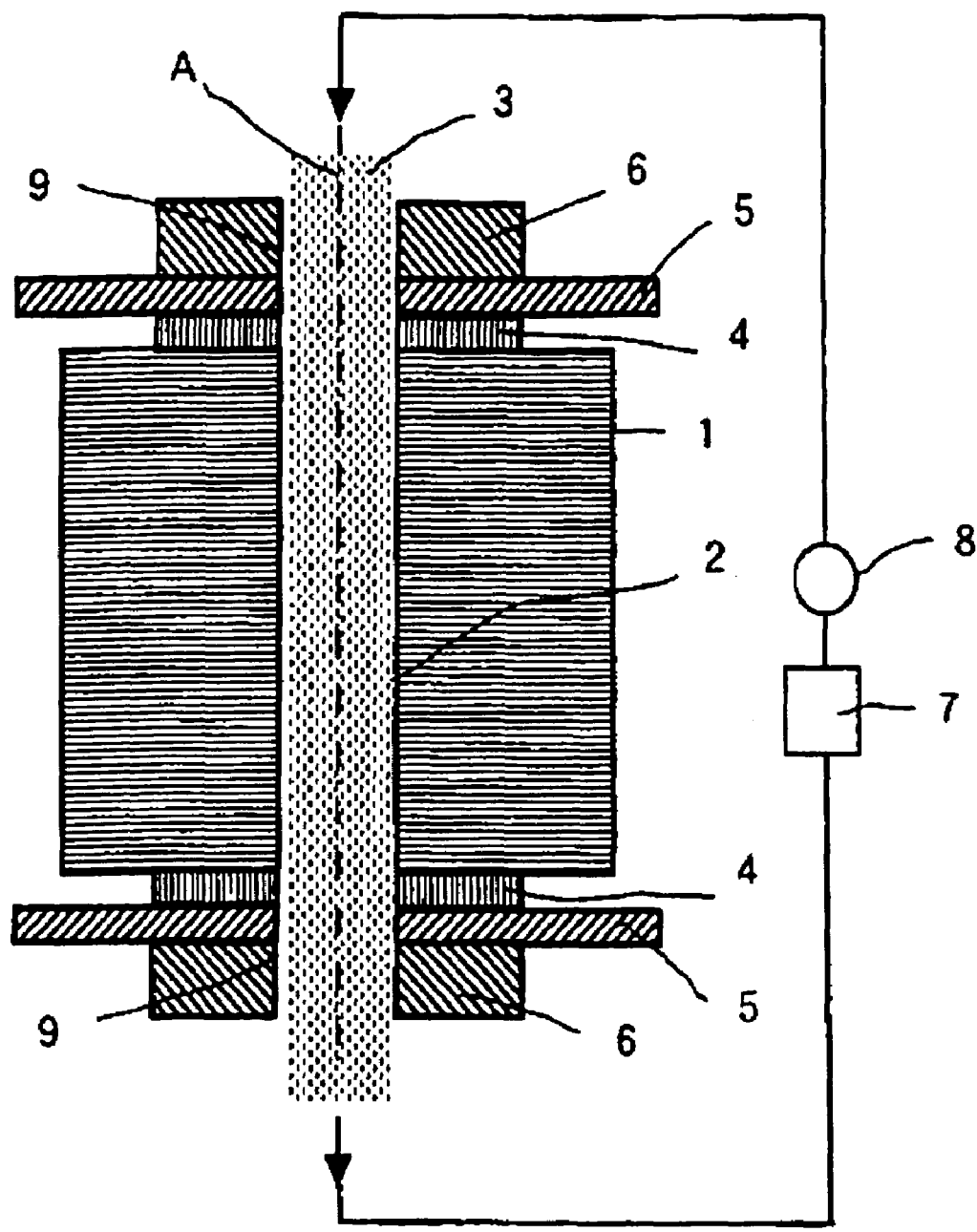
FIG. 1 is a cross-sectional view schematically illustrating one embodiment of the etching method of the present invention.

Now, the present invention will be described in detail with reference to the preferred embodiments.

The doughnut-type glass substrate of the present invention is a doughnut-type glass substrate having a circular disk shape with a predetermined radius and having a circular cut hole having substantially the same center as the center of the disk at a center portion of the disk, and having an inner peripheral edge surface, an outer peripheral edge surface and front and back main surfaces. In the following description, the glass substrate means such a doughnut-type glass substrate.

The dimensions of the doughnut-type glass substrates are not particularly limited, and the dimensions as represented by mm may, for example, be such that (a) inner diameter 7.0, outer diameter 21.4, plate thickness 0.38, (b) inner diameter 12.0, outer diameter 48.0, plate thickness 0.55, (c) inner diameter 25.0, outer diameter 84.0, plate thickness 1.0, (d) inner diameter 12.0, outer diameter 48.0, plate thickness 0.5, or (e) inner diameter 25.0, outer diameter 95.0, plate thickness 0.8.

The type of glass to be used for the doughnut-type glass substrates of the present invention is preferably a glass having the following characteristics, for the improvement of the weather resistance. However, the glass is not limited thereto.

Water resistance: When the glass is immersed in water of 80° C. for 24 hours, the weight reduction of the glass (eluted amount) due to elution of components from the glass, is not more than 0.02 mg/cm$^2$.

Acid resistance: When the glass is immersed in a 0.1 N hydrochloric acid aqueous solution of 80° C. for 24 hours, the weight reduction of the glass (eluted amount) due to elution of components from the glass, is not more than 0.06 mg/cm$^2$.

Alkali resistance: When the glass is immersed in a 0.1 N sodium hydroxide aqueous solution of 80° C. for 24 hours, the weight reduction of the glass (eluted amount) due to elution of components from the glass is not more than 1 mg/cm$^2$, more preferably not more than 0.18 mg/cm$^2$.

In the present invention, it is not required to use a chemical reinforcing method, and there is no lower limit in the content of an alkali metal such as Na or Li as the composition of the glass with a view to making chemical reinforcement possible. The glass which may be used for the doughnut-type glass substrates of the present invention, may, for example, be a glass having an alkali metal oxide content of from 1 to 20 mass %, such as soda lime silica glass, alumina silicate glass, alkali-free glass or crystallized glass.

The present invention is characterized in that, as mentioned above, a plurality of doughnut-type glass substrates are laminated so that their circular holes at their center form a cylindrical hole, and an etching liquid or an etching gas (hereinafter sometimes they will generically be referred to as an etching liquid or the like) is supplied to the cylindrical hole to etch an inner surface of the cylindrical hole, whereby inner peripheral edge surfaces of the glass substrates are etched. That is, when a plurality of doughnut-type glass substrates are laminated so that their circular holes at is their center are at the same position, a through-hole having a circular cross-section i.e. a cylindrical hole is formed by inner peripheral edge surfaces of the glass substrates at the center portion of the laminated glass substrates. An etching liquid or an etching gas is supplied to the cylindrical hole to apply an etching treatment to the inner surface of the cylindrical hole, whereby the inner peripheral edge surfaces of the plurality of the laminated glass substrates are etched all at once.

In the present invention, the number of glass substrates to be laminated is not limited. In the present invention, the inner peripheral edge surfaces of laminated glass substrates are etched all at once, and accordingly, as the number of substrates laminated increases, an etching treatment can be applied to the inner peripheral edge surfaces of a large number of glass substrates all at once. The number of glass substrates to be laminated depends on the thickness and is not limited, and in a case where thickness is from 0.35 to 1 mm, the number is appropriately from about 20 to about 250, in view of uniform etching of the inner surface of the cylindrical hole, productivity, workability of the etching operation, operation efficiency, etc.

For the etching treatment on the inner peripheral edge surfaces of laminated glass substrates i.e. the inner surface of the cylindrical hole, a common etching method for glass, such as a wet etching method by means of an etching liquid or a dry etching method by means of an etching gas, may, for example, be employed. Among them, a wet etching method employing an etching liquid such as a hydrofluoric acid solution, a hydrofluoric sulfuric acid solution or silicofluoric acid, can be preferably employed. Particularly preferred is a method employing a hydrofluoric sulfuric acid solution.

In the present invention, an etching liquid or the like is supplied to the cylindrical hole formed by the laminated glass substrates from one end of the cylindrical hole and is made to flow toward the other end in order that the inner peripheral edge surfaces are etched. The etching liquid or the like supplied to the cylindrical hole contacts the inner surface of the cylindrical hole and etches the inner peripheral edge surfaces of the glass substrates while it flows in the cylindrical hole toward the other end. In the preferred embodiment of the present invention, the etching liquid or the like after etching is discharged from the other end of the cylindrical hole and is supplied into the cylindrical hole again via or not via a tank for etching liquid or the like and recycled, so as to etch the inner surface of the cylindrical hole to a predetermined depth. During this etching, the etching liquid or the like is adjusted as the case requires.

Further, in the present invention, the etching treatment is carried out preferably in such a state that the glass substrates are held so that the center axis of the cylindrical hole is perpendicular, because when the glass substrates are laminated horizontally and the center axis of the cylindrical hole is perpendicular, it is possible to make the etching liquid or the like uniformly flow in the direction of the center axis of the cylindrical hole and uniformly etch the inner surface of the cylindrical hole. Further, when the etching liquid or the like is supplied to the cylindrical hole, it may be supplied either from the upper portion or the lower portion of the cylindrical hole. Further, although it is usually preferred to hold the glass substrates so that the center axis of the cylindrical hole is perpendicular for etching as mentioned above, it is possible to hold the glass substrates in a state where the center axis is tilted at a predetermined angle to the perpendicular direction for etching.

In a case where the inner peripheral edge surfaces of the laminated glass substrates are etched by means of an etching liquid, it is preferred to fill the cylindrical hole with the etching liquid and to make the etching liquid flow. For example, when the etching liquid is supplied from the upper portion of the cylindrical hole, the amount of the etching liquid discharged from the lower portion of the cylindrical hole is made to be the same as or smaller than the supply amount, whereby the cylindrical hole is filled with the etching liquid. When the entire cylindrical hole is filled with the etching liquid in such a manner, the entire inner peripheral edge surfaces of the respective laminated glass substrates are uniformly in contact with the etching liquid, whereby the inner peripheral edge surfaces can be etched efficiently and uniformly. Further, the etching treatment may be carried out by supplying the etching liquid to the cylindrical hole in a state where the glass substrates remain stationary or may be carried out by supplying the etching liquid to the cylindrical hole while rotating the glass substrates upon the center axis of the cylindrical hole. By rotating the glass substrates, the etching rate can be increased and further, etching can be carried out more uniformly. The flow rate of the etching liquid in the cylindrical hole may suitably be selected depending upon the type of the glass substrate, the type and concentration of the etching liquid, etc.

The present invention is to remove deep scars present on the inner peripheral edge surface, which govern the bending strength of the doughnut-type glass substrate, by an etching treatment. Accordingly, the etching depth is preferably from 3 to 50 µm, more preferably from 3 to 40 µm. If the etching depth is less than 3 µm, removal of deep scars present on the inner peripheral edge surface tends to be inadequate, whereby the mechanical strength tends to be low. Since only the inner peripheral edge surface of the glass substrate is partially etched, the upper limit of the etching depth is not necessarily strictly controlled as compared with conventional etching. However, if the etching depth exceeds 50 µm, the scar removal effect will no more increase, and high protrusions may form on the etched surface.

Further, in the present invention, when the etching treatment is applied to the inner peripheral edge surface of the glass substrate, the inner peripheral edge surface is preferably ground by abrasive grains of from #200 to #1000 mesh. When the inner peripheral edge surface is ground by abrasive grains having a grain size within the above range, scars present on the inner peripheral edge surface of the glass substrate can be efficiently removed by applying an etching treatment to the ground surface. Accordingly, a glass substrate having a desired strength will be obtained. Further, the ground surface may further be subjected to mirror finish processing and then etching is carried out, although the burden of grinding tends to increase.

Further, in the present invention, chamfering may be applied to corner portions of the inner peripheral edge surface thus ground, and then such glass substrates are laminated and an etching treatment is applied to the inner peripheral edge surfaces, whereby chamfered portions can be etched simultaneously. By such etching on the chamfered portions, the chamfered surfaces can be made smooth surfaces without scar, whereby the strength of the glass substrate will further improve by the chamfering effect in combination.

Now, the preferred embodiment of the present invention will be explained with reference to FIGS. 1 and 2. However, the present invention is by no means restricted thereto.

FIG. 1 is a cross-sectional view schematically illustrating a method comprising laminating a plurality of doughnut-type glass substrates 1 each having a cylindrical hole at its center so that the circular holes form a cylindrical hole 2, and supplying an etching liquid 3 to the cylindrical hole 2 so that inner peripheral edge surfaces of the glass substrates are etched.

Each of the glass substrates 1 have a circular hole at its center, and its inner peripheral edge surface and outer peripheral edge surface are ground into concentric circles having predetermined inner diameter and outer diameter, respectively. The ground inner peripheral edge surface and outer peripheral edge surface have desired surface roughness (Ra), and front and back main surfaces are processed to have desired flatness and smoothness. By preliminarily making the outer diameter and the inner diameter of each of the glass substrates 1 have such predetermined dimensions, when the glass substrates 1 are laminated so that they are arranged on the basis of the outer peripheral edge surfaces, the centers of the laminated glass substrates 1 (the centers of the circular holes) are at the same position. Accordingly, inner peripheral edge surfaces (cylindrical holes) of the continuously arranged and laminated glass substrates form a cylindrical hole 2 as shown in FIG. 1. In FIG. 1, A illustrates a center axis of the cylindrical hole 2.

In FIG. 1, glass substrates 1 to which an etching treatment is applied at a time are laminated. The laminated glass substrates are held by presser plates 5 via packings 4 at both ends and fixed by fixtures 6.

A flow path 9 to make an etching liquid flow therethrough is provided at a center portion of each of the packings 4, presser plates 5 and fixtures 6, and the flow path 9 communicates with the cylindrical hole 2. In such a case, the diameter of the flow path 9 is adjusted to be substantially the same as the diameter of the cylindrical hole 2, so that the etching liquid will not in contact with the upper main surface of the top glass substrate and the lower main surface of the bottom glass substrate of the laminate consisting of the laminated glass substrates. That is, it is arranged so that the etching liquid will not leak out from the flow path 9. By providing the flow path 9 for an etching liquid, having the same diameter as that of the cylindrical hole 2, on each side of the cylindrical hole 2 of the laminated glass substrates i.e. a glass substrate laminate, the etching liquid 3 will be smoothly introduced to and discharged from the cylindrical hole 2, and the etching liquid 3 will be made to uniformly flow from the introduction end to the discharge end of the cylindrical hole 2, whereby the entire inner surface of the cylindrical hole 2 will be uniformly etched. However, the diameter of the flow path 9 does not necessarily strictly agree with the diameter of the cylindrical hole 2 so long as the above object can be achieved.

In this embodiment, such laminated glass substrates 1 are set so that the center axis A of the cylindrical hole 2 is perpendicular, the etching liquid 3 stored in a tank 7 is supplied by a pump 8 from the upper end of the cylindrical hole 2 and made to flow in the cylindrical hole, so that the inner peripheral edge surfaces of the glass substrates 1 are etched by the etching liquid. In such a case, it is preferred that the etching liquid 3 flows in a state where the cylindrical hole 2 is filled with the etching liquid 3 by adjusting the amounts of the etching liquid 3 injected and discharged. The etching liquid 3 supplied to the cylindrical hole 2 uniformly flows toward the discharge end in a state where the cylindrical hole of which the center axis A is perpendicular, is filled with the etching liquid 3. Accordingly, the etching liquid 3 is evenly brought into contact with the inner surface of the cylindrical hole 2 and uniformly etches the inner peripheral edge surfaces of the glass substrates 1.

The etching liquid discharged from the cylindrical hole 2 is returned to the tank 7 and then supplied to the cylindrical hole 2 again by a recycle system to etch the inner peripheral edge surfaces of the glass substrates 1. During this etching treatment, the concentration of the etching liquid is adjusted as the case requires.

Further, etching may be carried out in the same manner by making the cylindrical hole 2 be filled with an etching gas instead of the etching liquid and making the etching gas flow, or by spraying an etching gas on the inner surface of the cylindrical hole 2, which is not shown in FIG. 1.

Figure 2:
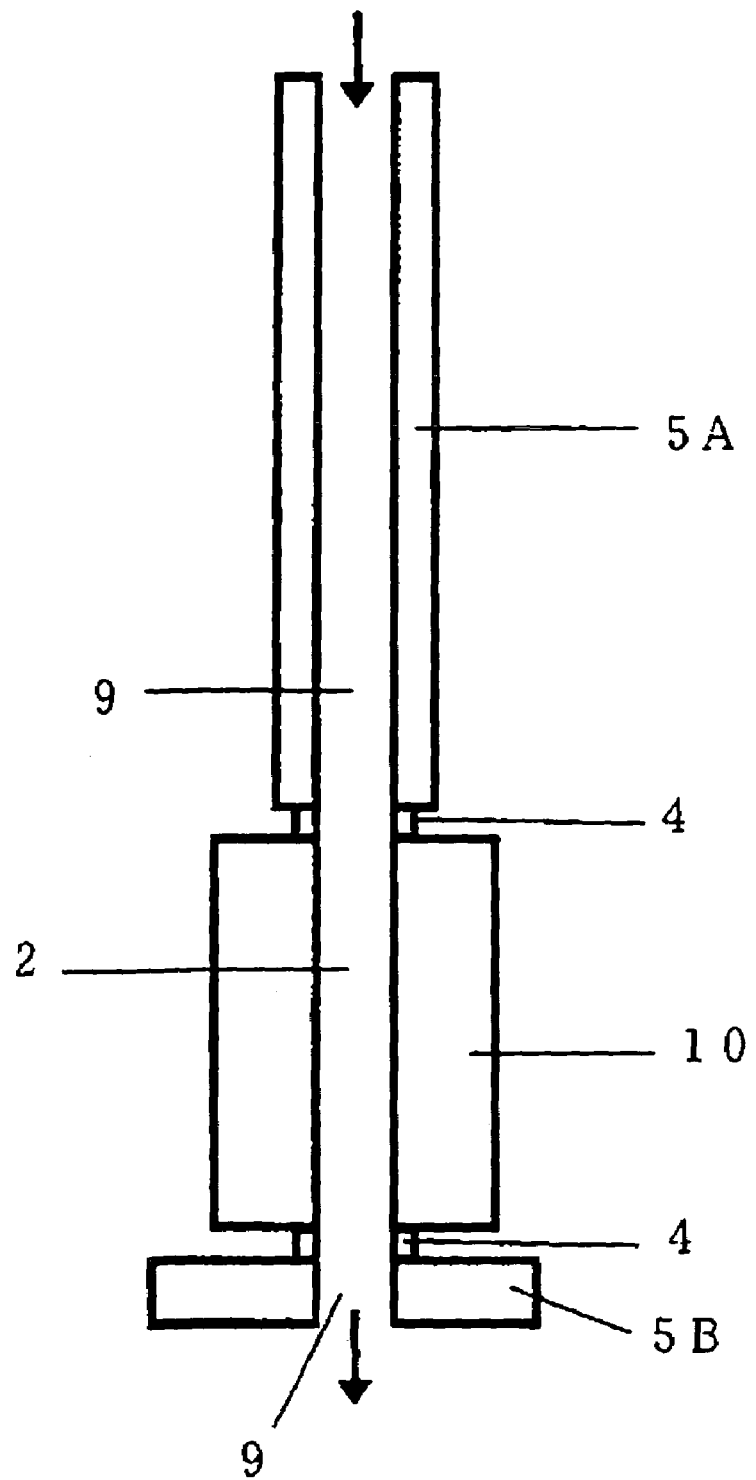
FIG. 2 is a cross-sectional view schematically illustrating one preferred embodiment of the etching method of the present invention.

FIG. 2 is a cross-sectional view schematically illustrating one example of the preferred embodiment in a case where an etching treatment is carried out by means of an etching liquid.

An etching liquid is injected into a flow path in a duct (disk pressure nozzle) 5A from its upper portion, passes through a packing 4 and is supplied to a cylindrical hole 2. The flow path of the duct 5A and the hole of the packing 4 form a flow path 9.

The etching liquid in the cylindrical hole 2 passes through a packing 4 from the lower end of the cylindrical is hole 2, and passes through a hole formed on a presser plate 5B and is discharged. The holes of the packing 4 and the presser plate 5B form a flow path 9.

As the packing 4, an O-ring may, for example, be used, and its inner diameter is equal to the diameter of the cylindrical hole 2.

The duct 5A is connected with the upper end of the cylindrical hole 2 via the packing 4 placed on a glass substrate laminate 10. The duct 5A functionally corresponds to the upper presser plate 5 of FIG. 1, and the diameter of the flow path in the duct is equal to the diameter of the cylindrical hole 2.

Although one corresponding to the upper fixture 6 of FIG. 1 is not shown in FIG. 2, a weight which is not shown, for example, is attached to the duct 5A, and the packing 4 is pressed against the upper surface of the glass substrate laminate 10 by the duct 5A.

The packing 4 has to be uniformly pressed against the upper surface of the glass substrate laminate 10 by the duct 5A, or the etching liquid may leak through a space between the packing 4 and the duct 5A or the upper surface of the glass substrate laminate 10, and the etching liquid will be in contact with the exposed main surface of the doughnut-type glass substrate which is the upper surface of the glass substrate laminate 10.

In order that the packing 4 is uniformly pressed, for example, the duct 5A has to be pressed against the packing 4 as follows. That is, a guide (not shown) for setting the duct 5A is fixed and provided on a frame which is not shown at an appropriate position corresponding to the upper half of the duct 5A in a state where it is pressed against the packing 4. The diameter of the setting guide is larger than the diameter of the duct 5A by from about 1 to about 2 mm. On the other hand, the packing 4 is placed on the upper surface of the glass substrate laminate 10 so that its center is at the same position as the center axis of the cylindrical hole 2.

Then, the duct 5A is inserted into the setting guide and put on the packing 4, the above weight is attached to the duct 5A, and the axis of the duct 5A is set to agree with the center axis of the cylindrical hole 2. Since a space of from about 1 to about 2 mm is present between the setting guide and the duct 5A as described above, it is easy to let the axis of the duct 5A agree with the center axis of the cylindrical hole 2 even when the upper surface of the glass substrate laminate 10 is not completely horizontal. Resultingly, the packing 4 is uniformly pressed against the upper surface of the glass substrate laminate 10 by the duct 5A.

The presser plate 5B located below the lower surface of the glass substrate laminate 10 is fixed on the above frame, and the presser plate 5B has a hole with the same diameter as that of the cylindrical hole 2.

The packing 4 is placed on the presser plate 5B, and the center of the packing 4 is made to agree with the center axis of the hole of the presser plate 5B. On the packing 4, the glass substrate laminate 10 is placed, and the center axis of the cylindrical hole 2, the center of the packing 4 and the center axis of the hole of the presser plate 5B are made to agree with one another.

The lower surface of the glass substrate laminate 10 is pressed against the packing 4 by a force from the duct 5A and the weight of the glass substrate laminate 10, and the packing 4 is uniformly pressed against the presser plate 5B. Accordingly, the etching liquid to be discharged from the lower end of the cylindrical hole 2 passes through the holes of the packing 4 and the presser plate 5B (such holes form a flow path 9 at a portion below the glass substrate laminate 10) without leaking through spaces between the packing 4 and the lower surface of the glass substrate laminate 10 and between the packing 4 and the presser plate 5B.

Now, the present invention will be described in further detail with reference to Examples. However, it should be understood that the present invention is by no means restricted to such specific Examples.

150 sheets of doughnut-type glass substrates having an outer diameter of 65 mm, an inner diameter of 20 mm and a thickness of 0.9 mm were prepared which were made of glass having a composition comprising, as calculated as oxides, 56 mass % of $SiO_2$, 6 mass % of $B_2O_3$, 11 mass % of $Al_2O_3$, 0.05 mass % of $Fe_2O_3$, 0.1 mass % of $Na_2O$, 2 mass % of MgO, 3 mass % of CaO, 15 mass % of BaO and 6.5 mass % of SrO.

The inner and outer peripheral edge surfaces of each of the above doughnut-type glass substrates were subjected to finish polishing with diamond abrasive grains smaller than #500 mesh, so that the concentricity of the outer and inner peripheries (the distance between the centers of the inner circle and the outer circle) was at most 25 μm and the roundness was at most 25 μm. Then, the glass substrates were subjected to lapping with alumina abrasive grains having an average particle size of 9 μm and ground until the thickness became about 0.9 mm.

150 glass substrates thus processed were laminated and held as shown in FIG. 1 so that their circular holes at their center would form a cylindrical hole, and a hydrofluoric sulfuric acid solution containing 5% each of hydrofluoric acid and sulfuric acid was supplied to the cylindrical hole and made to flow in the cylindrical hole to etch inner peripheral edge surfaces of the glass substrates to a depth of about 20 μm all at once.

After the etching treatment, the laminated glass substrates were separated, and the inner peripheral edge surfaces of the glass substrates were visually observed and as a result, it was confirmed that the ground inner peripheral edge surfaces were etched.

Further, the inner diameters of the glass substrates were measured to examine the dispersion and as a result, all the diameters were within an acceptable range of a specified dimension of ±2 μm, and it was found that a large number of glass substrates can be uniformly etched all at once.

According to the present invention, an etching treatment can be applied to inner peripheral edge surfaces of a large number of doughnut-type glass substrates all at once. Accordingly, the present invention can reduce the cost, and is useful for production of high quality glass substrates for magnetic disks.

The entire disclosure of Japanese Patent Application No. 2004-352994 filed on Dec. 6, 2004 including specification, claims, drawings and summary are incorporated herein by reference in its entirety.

What is claimed is:

1. A method for etching doughnut-type glass substrates, which comprises:
   (1) laminating a plurality of doughnut-type glass substrates, each substrate having a circular hole at its centers, so that the circular holes of the laminate form a cylindrical hole, and
   (2) applying an etching treatment to inner peripheral edge surfaces of the plurality of the laminated doughnut-type glass substrates all at once by contact with an etching liquid or an etching gas;
   wherein the etching liquid or the etching gas is supplied from one end of the cylindrical hole, made to flow in the cylindrical hole, and discharged from the other end of the cylindrical hole so that it is not in contact with exposed main surfaces of the doughnut-type glass substrates at both ends of the laminate consisting of the doughnut-type glass substrates.

2. The method for etching doughnut-type glass substrates according to claim 1, wherein the etching treatment is carried out in a state where the plurality of the laminated doughnut-type glass substrates are held so that the center axis of the cylindrical hole is perpendicular to the horizontal plane of the laminated doughnut-type glass substrates.

3. The method for etching doughnut-type glass substrates according to claim 2, wherein a duct having a flow path with the same diameter as the diameter of the cylindrical hole is connected to one end of the cylindrical hole via a packing having a flow path with substantially the same diameter as the diameter of the cylindrical hole, and the etching liquid or the etching gas is supplied to said one end of the cylindrical hole employing a flow path thus formed.

4. The method for etching doughnut-type glass substrates according to claim 1, wherein the etching liquid or the etching gas after the etching treatment is recycled.

5. The method for etching doughnut-type glass substrates according to claim 1, wherein the etching treatment is carried out while rotating the plurality of the laminated doughnut-type glass substrates on the center axis of the cylindrical hole.

6. The method for etching doughnut-type glass substrates according to claim 1, wherein the amount of etching on the inner periphery edge surfaces is from 3 to 50 μm.

7. The method for etching doughnut-type glass substrates according to claim 1, wherein the etching treatment is carried out by contact with an etching liquid.

8. The method for etching doughnut-type glass substrates according to claim 7, wherein the etching liquid is selected from the group consisting of a hydrofluoric acid solution, a hydrofluoric sulfuric acid solution and a silicofluoric acid solution.

9. The method for etching doughnut-type glass substrates according to claim 1, wherein the plurality of the doughnut-type glass substrates is laminated so that the center axis of the cylindrical hole is perpendicular, and held at both sides via a packing having a flow path with substantially the same diameter as the diameter of the cylindrical hole.

10. The method for etching doughnut-type glass substrates according to claim 1, which further comprises separating each doughnut-type glass substrate from the laminate of the doughnut-type glass substrates after applying the etching treatment.

11. The method for etching doughnut-type glass substrates according to claim 10, wherein the diameters of the circular holes of all the separated doughnut-type glass substrates are uniformly etched to within ±2 μm of each other.

12. The method for etching doughnut-type glass substrates according to claim 11, wherein the separated doughnut-type glass substrates are useful for producing magnetic disks.

13. The method for etching doughnut-type glass substrates according to claim 11, wherein the separated doughnut-type glass substrates have an outer diameter in the range of 21.4 to 95.0 mm, an inner diameter in the range of 7.0 to 25.0 mm, and a thickness in the range of 0.35 to 1.0 mm.

14. The method for etching doughnut-type glass substrates according to claim 13, wherein the glass of the separated doughnut-type glass substrates has an alkali metal oxide content of from 1 to 20 mass%.

15. The method for etching doughnut-type glass substrates according to claim 13, wherein the separated doughnut-type glass substrates have a glass composition comprising 56 mass % $SiO_2$, 6 mass % $Ba_2O_3$, 11 mass % $Al_2O_3$, 0.05 mass % $Fe_2O_3$, 0.1 mass % $NaO_2$, 2 mass % MgO, 3 mass % CaO, 15 mass % BaO, and 6.5 mass % SrO.

16. The method for etching doughnut-type glass substrates according to claim 1, which comprises laminating from about 20 to about 250 doughnut-type glass substrates and applying the etching treatment to the inner peripheral edge surfaces of the laminated doughnut-type glass substrates.

* * * * *